(12) United States Patent
Ng et al.

(10) Patent No.: US 6,904,576 B2
(45) Date of Patent: Jun. 7, 2005

(54) METHOD AND SYSTEM FOR DEBUGGING USING REPLICATED LOGIC

(75) Inventors: Chun Kit Ng, Portland, OR (US); Kenneth S. McElvain, Los Altos, CA (US)

(73) Assignee: Synplicity, Inc., Sunnyvale, CA (US)

( * ) Notice: Subject to any disclaimer, the term of this patent is extended or adjusted under 35 U.S.C. 154(b) by 103 days.

(21) Appl. No.: 10/215,869

(22) Filed: Aug. 9, 2002

(65) Prior Publication Data

US 2004/0030999 A1 Feb. 12, 2004

(51) Int. Cl.$^7$ .............................................. G06F 17/50
(52) U.S. Cl. ...................... 716/4; 716/5; 716/7; 716/18
(58) Field of Search .............................. 716/4, 18, 5, 7, 716/8, 3

(56) References Cited

U.S. PATENT DOCUMENTS

| | | | | |
|---|---|---|---|---|
| 5,056,094 A | * | 10/1991 | Whetsel ...................... 714/736 |
| 5,452,239 A | * | 9/1995 | Dai et al. ...................... 703/19 |
| 5,495,487 A | * | 2/1996 | Whetsel, Jr. ................. 714/736 |
| 5,706,473 A | | 1/1998 | Yu et al. |
| 6,014,510 A | * | 1/2000 | Burks et al. ................... 703/19 |
| 6,269,467 B1 | | 7/2001 | Chang et al. |
| 6,438,735 B1 | * | 8/2002 | McElvain et al. .............. 716/7 |
| 6,516,449 B2 | * | 2/2003 | Masud ........................... 716/3 |
| 6,530,073 B2 | * | 3/2003 | Morgan ........................ 716/18 |
| 6,557,145 B2 | * | 4/2003 | Boyle et al. .................... 716/2 |
| 6,651,227 B2 | * | 11/2003 | Abadir et al. .................. 716/4 |
| 6,668,364 B2 | * | 12/2003 | McElvain et al. .............. 716/7 |
| 6,687,882 B1 | * | 2/2004 | McElvain et al. .............. 716/3 |
| 2001/0025369 A1 | | 9/2001 | Chang et al. |
| 2002/0138801 A1 | * | 9/2002 | Wang et al. ................. 714/729 |
| 2003/0079195 A1 | * | 4/2003 | McElvain et al. .............. 716/8 |

OTHER PUBLICATIONS

I. Neumann et al., Cell Replication and Redundancy Elimination During Placement for Cycle Time Optimization, 1999 IEEE/ACM International Conference on Computer–Aided Design, Nov. 1999, pp. 25–30.*

PCT International Search Report for PCT International Appln No. US03/24601, mailed Apr. 16, 2004 (7 pages).

* cited by examiner

Primary Examiner—A. M. Thompson
(74) Attorney, Agent, or Firm—Blakely, Sokoloff, Taylor & Zafman LLP

(57) ABSTRACT

A method and apparatus is provided to debug using replicated logic. A text representation of a circuit is compiled to generate a first register transfer level (RTL) netlist. The netlist may be mapped to a target architecture, such as a field programmable gate array (FPGA). The netlist may be used to program an FPGA to create a prototype board for debugging. After debug, a portion of the circuit that a designer would like to analyze is selected. The selected portion of the circuit is replicated. Delay logic is inserted to delay the inputs into the replicated portion of the circuit. The text representation of the circuit is recompiled to generate a second RTL netlist. The second RTL netlist may be mapped to a target architecture, such as a FPGA or application specific integrated circuit (ASIC).

27 Claims, 4 Drawing Sheets

METHOD AND SYSTEM FOR DEBUGGING USING REPLICATED LOGIC

BACKGROUND OF THE INVENTION

1. Field of the Invention

The invention relates to the field of debugging integrated circuits, and more particularly to debugging integrated circuits using replicated logic.

2. Background Information and Description of Related Art

For the design of digital circuits, designers often employ computer aided techniques. Standard languages, such as Hardware Description Languages (HDLs), have been developed to describe digital circuits to aid in the design and simulation of complex digital circuits. As device technology continues to advance, various product design tools have been developed to adapt HDLs for use with newer devices and design styles.

After the HDL code is written and compiled, the design of an integrated circuit (IC) or a system which includes multiple ICs must be verified to be correct. Continually advancing processing technology and the corresponding explosion in design size and complexity have led to verification problems for complex circuit designs, such as Application Specific Integrated Circuits (ASICs) that are difficult to solve using traditional simulation tools and techniques.

As a result, some designers build prototype boards using multiple ICs such as field programmable gate arrays (FPGAs) to verify their ASIC designs. However, there are still problems with debugging the hardware design. When an error is detected during debug, designers may attempt to tap signals of interest from the circuit and use a logic analyzer to determine the cause of the error. However, this is a difficult process and is often not effective, especially in the case of intermittent errors. Errors that have already occurred are often difficult to repeat and reconstruct.

SUMMARY

The invention discloses methods and apparatuses for debugging using replicated logic. According to one aspect of the invention, a text representation of a circuit is compiled to generate a first register transfer level (RTL) netlist. The first RTL netlist may be mapped to a target architecture, such as a field programmable gate array (FPGA), to create a prototype board for debugging the circuit. After debug, a designer may find a problem area in the circuit. The designer may select this portion of the circuit to replicate for further analysis. The selected portion of the circuit is replicated. Delay logic is inserted to delay inputs into the replicated portion of the circuit. Clock control logic may be inserted to allow the clock to the replicated portion of the circuit to be paused. The text representation of the circuit is recompiled to generate a second RTL netlist. The second RTL netlist may be mapped to a target architecture, such as a FPGA or an application specific integrated circuit (ASIC).

According to one aspect of the invention, apparatuses are provided to carry out the above and other methods.

BRIEF DESCRIPTION OF DRAWINGS

The invention is illustrated by way of example, and not by way of limitation, in the figures of the accompanying drawings in which like reference numerals refer to similar elements.

DETAILED DESCRIPTION OF THE INVENTION

Embodiments of a method and apparatus for debugging using replicated logic are described. In the following description, numerous specific details are provided for a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
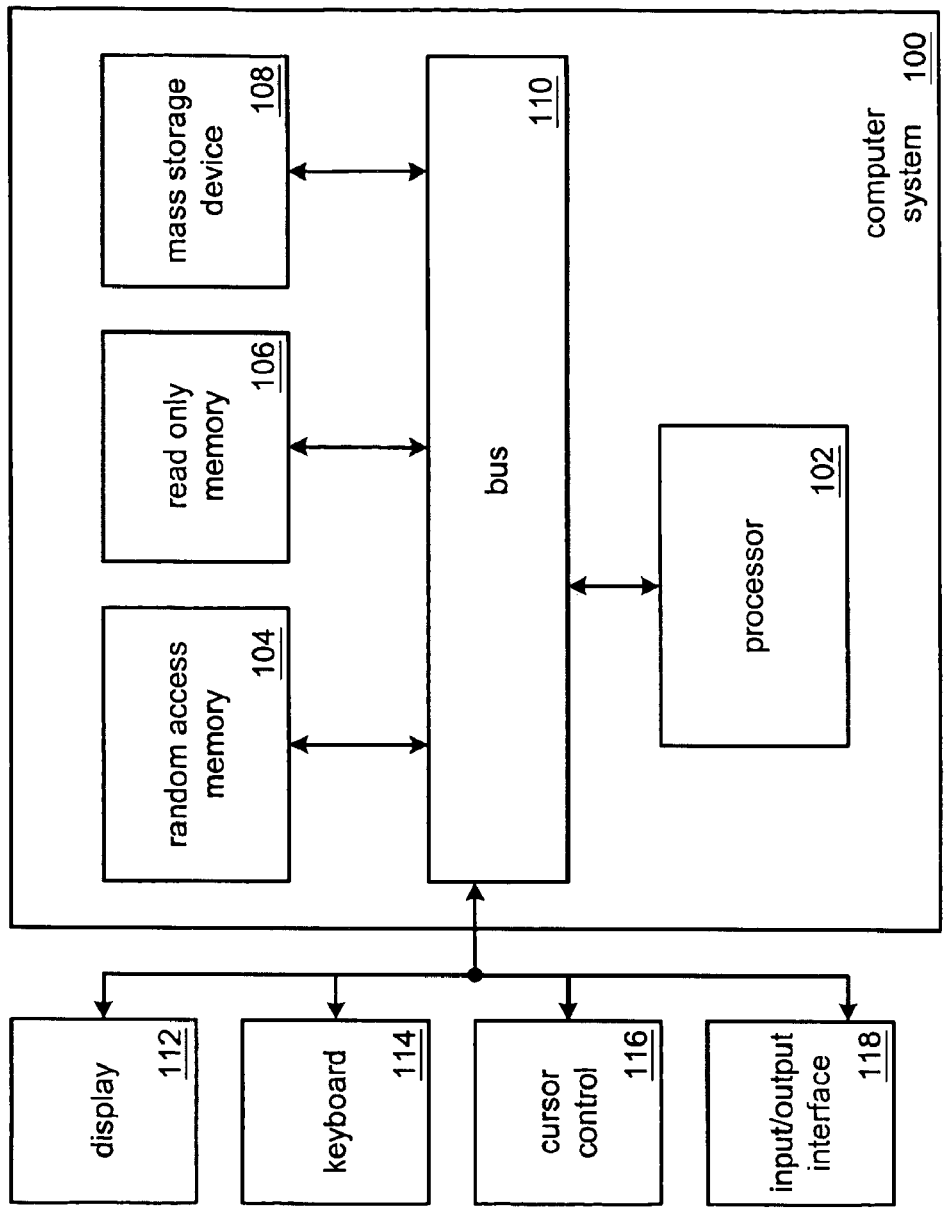
FIG. 1 illustrates a block diagram of a computer system that may be used to implement embodiments of the invention.

FIG. 1 illustrates a block diagram of a computer system 100 that may be used to implement an embodiment of the invention. The computer system 100 includes a processor 102 coupled through a bus 110 to a random access memory (RAM) 104, a read-only memory (ROM) 106, and a mass storage device 108. Mass storage device 108 represents a persistent data storage device, such a floppy disk drive, fixed disk drive (e.g. magnetic, optical, magneto-optical, or the like), or streaming tape drive. Processor 102 may be embodied in a general purpose processor, a special purpose processor, or a specifically programmed logic device.

Display device 112 is coupled to processor 102 through bus 110 and provides graphical output for computer system 100. Keyboard 114 and cursor control unit 116 are coupled to bus 110 for communicating information and command selections to processor 102. Also coupled to processor 102 through bus 110 is an input/output (I/O) interface 118, which can be used to control and transfer data to electronic devices (printers, other computers, etc.) connected to computer system 100.

It should be noted that the architecture of FIG. 1 is provided only for purposes of illustration, and that a computer used in conjunction with embodiments of the invention is not limited to this specific architecture.

As will be appreciated by those skilled in the art, the content for implementing an embodiment of a method of the invention, for example, computer program instructions, may be provided by any machine-readable media which can store data that is accessible by system 100, as part of or in addition to memory, including but not limited to cartridges, magnetic cassettes, flash memory cards, digital video disks, random access memories (RAMs), read-only memories (ROMs), and the like. In this regard, the system 100 is equipped to communicate with such machine-readable media in a manner well-known in the art.

It will be further appreciated by those skilled in the art that the content for implementing an embodiment of the method of the invention may be provided to the system 100 from any external device capable of storing the content and communicating the content to the system 100. For example, in one embodiment, the system 100 may be connected to a network, and the content may be stored on any device in the network.

Figure 2:
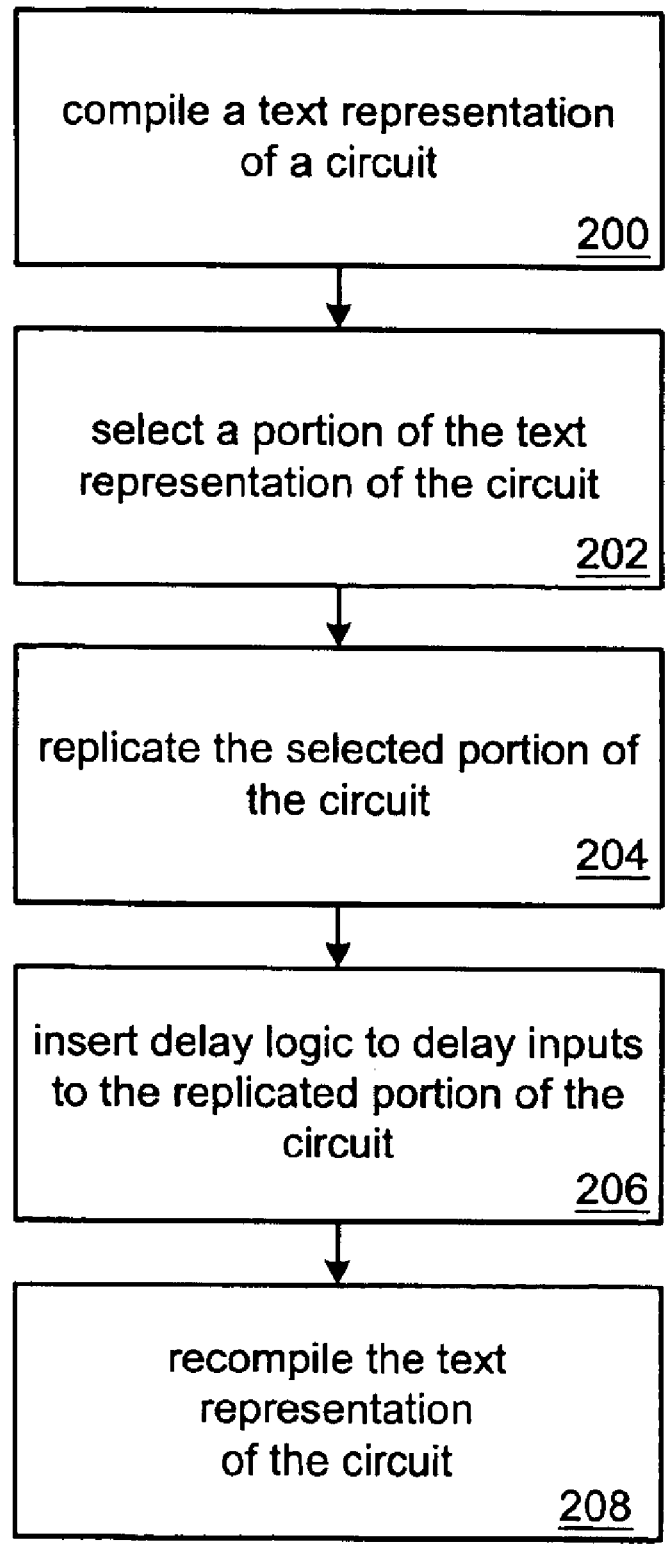
FIG. 2 is a flow chart illustrating an embodiment of a method of the invention.

FIG. 2 is a flow chart illustrating an embodiment of a method of the invention. At 200, a text representation of a circuit is compiled to generate a first register transfer (RTL) netlist. A circuit is typically described by a text representation by writing Hardware Description Language (HDL) source code descriptions of the elements of the circuit. Writing HDL source code is well described in literature. See, for example, Verilog HDL: a Guide to Digital Design and Synthesis, Samir Palnithar, SunSoft Press, 1996; also see, A VHDL Synthesis Primer, J. Bhasher, Star Galaxy Publishing, 1996.

The text representation is then input into a compiler. One example of a compiler is a logic synthesis compiler, which is typically a computer program that operates on a general purpose computer system, although in some embodiments, the computer system may be a dedicated, special purpose computer system. An example of a logic synthesis compiler is the program "Synplify™" from Synplicity, Inc. of Sunnyvale, Calif. After compilation, a RTL netlist is generated. The RTL netlist usually shows registers and other logic interconnected to show the flow of data through a circuit that was described in the text representation.

In one embodiment of the invention, the RTL netlist is mapped to a target architecture. The target architecture is typically determined by a supplier of the integrated circuit (IC). Examples of target architectures include field programmable gate arrays (FPGAs) and complex programmable logic devices from vendors such as Altera, Lucent Technologies, Advanced Micro Devices (AMD), and Lattice Semiconductor. The mapping operation converts the RTL level description of the desired circuit into the equivalent circuit implemented using building blocks of the target architecture. A technology specific netlist is generated. Conventional place and route software tools may then be used to create a design of circuitry in the target architecture.

For debugging purposes, IC designers may build prototype boards using multiple ICs such as FPGAs to verify their designs. For example, after the compilation, mapping, and place and route operations, the circuit may be programmed into FPGAs to create a prototype of the design. The FPGAs can then be tested to determine any problem areas in the design.

When a problem area is found in the design, the designer may select that portion of the circuit to replicate to further analyze the problem. At 202, a portion of the circuit is selected. At 204, the selected portion of the circuit is replicated. This replication may include a replication of the logic elements, the input signals, and the output signals of the selected portion of the circuit.

In one embodiment of the invention, clock signals are also replicated. Clock control logic is inserted to control the clock signals. The clock control logic allows the clock to the replicated logic block to be paused to stop the replicated logic from executing when certain conditions are present and to allow for single-stepping through the replicated logic to analyze an error. The designer may select a breakpoint to pause the clock to the replicated portion of the circuit when certain conditions are present. For example, the designer may choose values for the outputs or inputs that will pause the clock. This allows the designer to analyze the selected logic more carefully when certain problem conditions are present.

At 206, delay logic is inserted to delay inputs into the replicated portion of the circuit. The length of the delay may be selected by the circuit designer. The delay logic allows an error observed in the selected portion of the circuit to be analyzed after the error is seen to occur since the error will reappear in the replicated portion of the circuit at a later time.

At 208, the text representation of the circuit is recompiled to generate a second RTL netlist. Then, the mapping and place and route operations may be performed using the second RTL netlist to implement the circuit in a target architecture, such as a FPGA. In one embodiment of the invention, a synthesis operation is performed to generate an application specific integrated circuit (ASIC) from the second RTL netlist. A circuit with replicated logic is produced that allows a circuit designer to analyze a problem area in the design.

Figure 3:
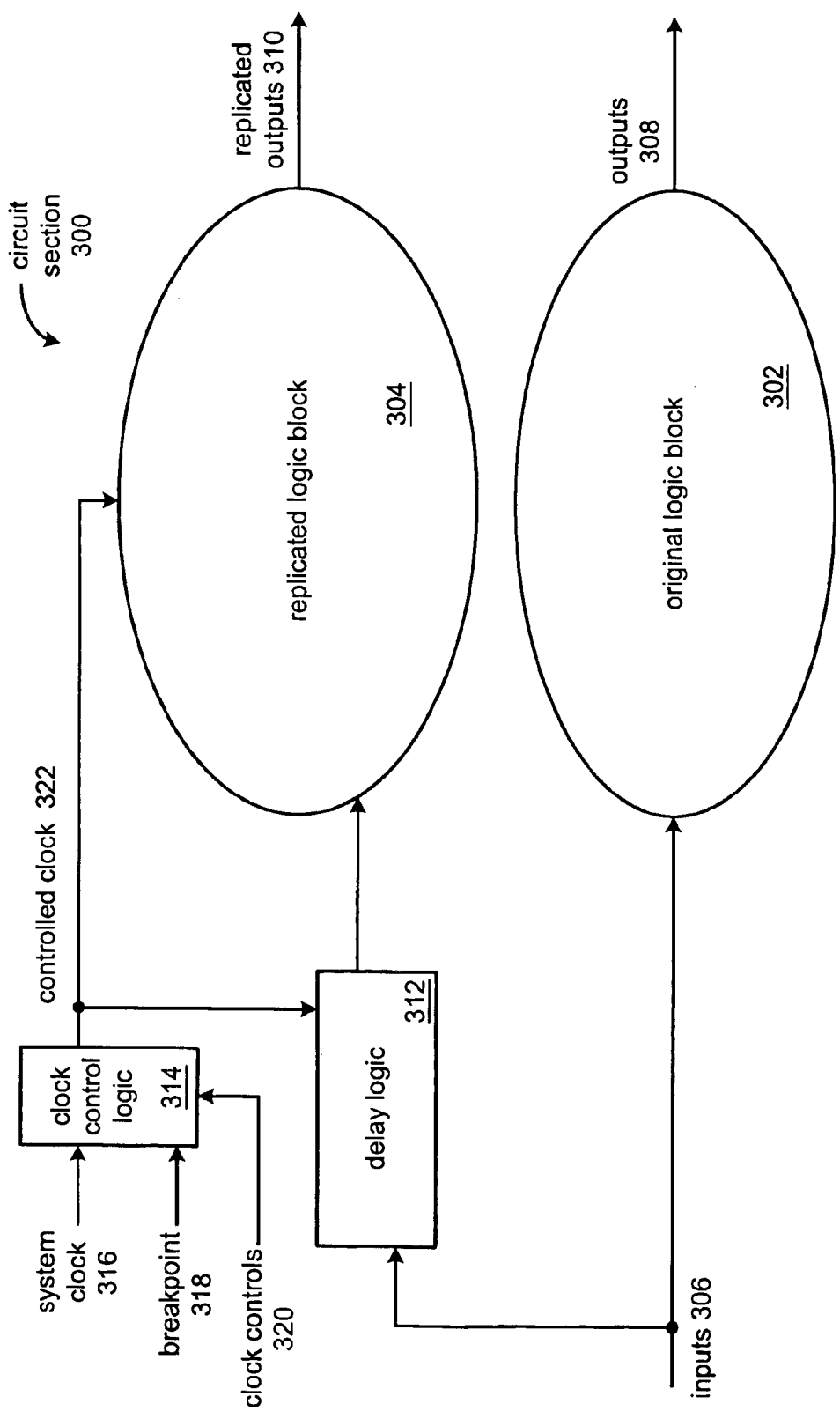
FIG. 3 illustrates an example of a circuit section implementing an embodiment of the invention.

FIG. 3 illustrates an example of a section of a circuit 300 implementing an embodiment of the invention. Logic block 302 is a portion of the circuit in the original IC design. Debug of the original IC design revealed a problem with logic block 302. Therefore, original logic block 302 was selected and replicated to enable further analysis of the problem. The original logic block 302 is replicated to produce a replicated logic block 304. Outputs 308 from the original logic block 302 are replicated to produce replicated outputs 310. Inputs 306 may also be replicated.

Delay logic 312 is inserted to delay inputs 306 into replicated logic block 304. The delay logic includes typical circuit logic and elements, such as inverters, that cause the inputs 306 to arrive at the replicated logic block 304 later in time than the inputs 306 will arrive at the original logic block 302. In this way, an error can be analyzed after the error is seen to occur in the original logic block, since the error will appear in the replicated logic block at a later time.

Clock control logic 314 is inserted to control the clock signals 322 to the replicated logic block 304. The clock control logic 314 contains typical logic and circuit elements that allow the clock 322 to the replicated logic block 304 to be paused to stop the replicated logic from executing when certain conditions are present. The clock control logic 314 may also allow for single stepping through the replicated logic on a clock by clock basis to analyze an error. A breakpoint 318 may be set to pause the clock when certain conditions are present.

Figure 4:
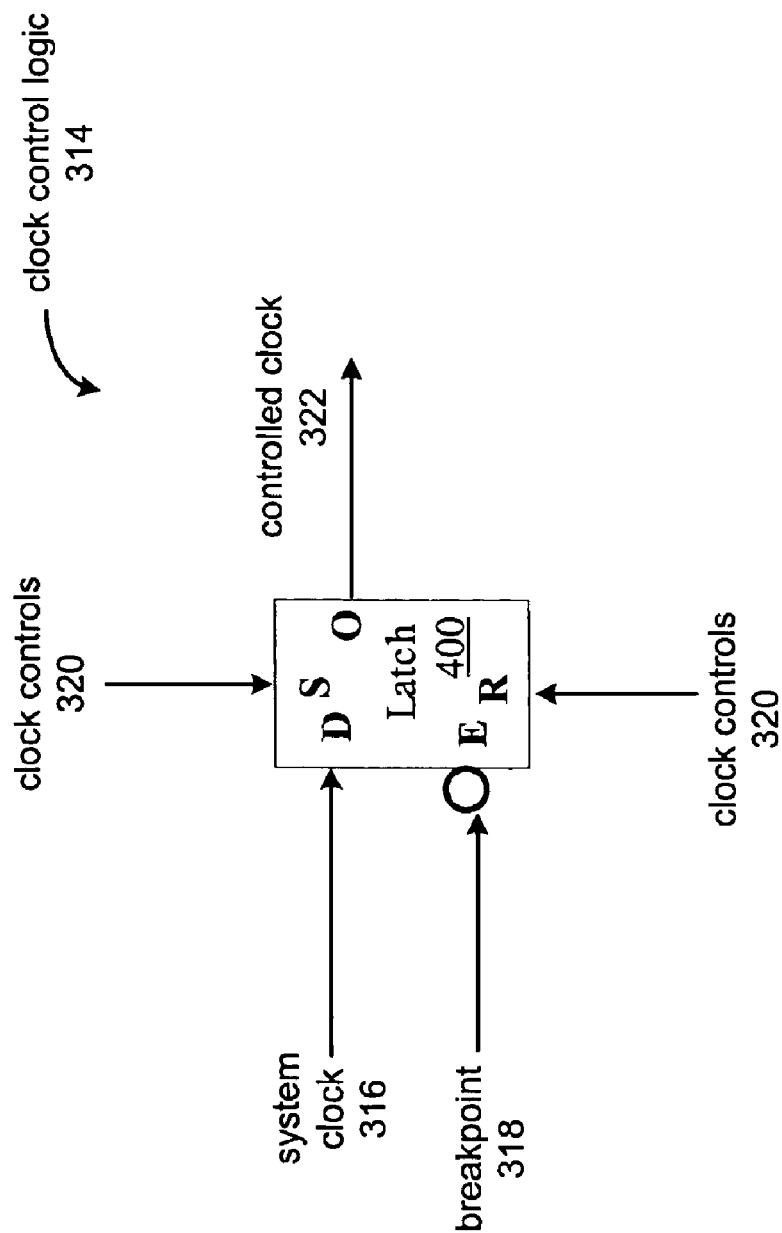
FIG. 4 illustrates an example of clock control logic according to an embodiment of the invention.

FIG. 4 illustrates an example of the clock control logic 314 according to an embodiment of the invention. During normal operation, the system clock 316 that clocks the circuit flows through the latch 400 and acts as the clock 322 to the replicated logic block 304. The breakpoint 318 switches the clock 322 to a latched version of the system clock 316, which can be controlled by clock control signals 320 in order to allow the clock 322 to be paused and single-stepped on a cycle by cycle basis.

Thus, embodiments of a method and apparatus for debugging using replicated logic have been described. The above description of illustrated embodiments of the invention, including what is described in the abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize. These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. A debugging method comprising:
   compiling a text representation of a circuit to generate a first register transfer level netlist;
   selecting a portion of the text representation of the circuit;
   replicating the selected portion of the circuit;
   inserting delay logic to delay inputs to the replicated portion of the circuit; and
   recompiling the text representation of the circuit to generate a second register transfer level netlist.

2. The method of claim 1, wherein the text representation is written in a hardware description language.

3. The method of claim 1, wherein replicating the selected portion of the circuit includes replicating clock signals to the selected portion of the circuit.

4. The method of claim 3, further comprising inserting logic to control the clock signals to the replicated portion of the circuit to enable execution of the replicated portion of the circuit to be paused.

5. The method of claim 1, further comprising mapping the first register transfer level netlist to a selected technology architecture.

6. The method of claim 5, further comprising performing a place and route operation to implement the circuit in the selected technology architecture.

7. The method of claim 6, further comprising programming the first register transfer level netlist into a programmable hardware device.

8. The method of claim 7, further comprising testing a prototype of the circuit with the programmable hardware device.

9. The method of claim 7, wherein the programmable hardware device is a field programmable gate array.

10. The method of claim 1, further comprising programming the second register transfer level netlist into a programmable hardware device.

11. The method of claim 1, further comprising generating an application specific integrated circuit from the second register transfer level netlist.

12. An integrated circuit comprising:
    a plurality of logic elements;
    a replication of one or more of the plurality of logic elements;
    delay logic coupled to the replicated portion of the circuit to delay inputs into the replicated portion of the circuit; and
    clock control logic coupled to the replicated portion of the circuit to enable the execution of the replicated portion of the circuit to be paused.

13. The integrated circuit of claim 12, wherein the clock control logic includes a breakpoint to pause the replicated portion of the circuit.

14. The integrated circuit of claim 12, wherein the clock control logic further includes logic to enable the replicated portion of the circuit to be executed on a clock by clock basis.

15. The integrated circuit of claim 12, wherein the clock control logic comprises a latch.

16. A machine readable medium containing a plurality of executable instructions, which when executed on a digital processing system cause the digital processing system to perform a debugging method comprising:
    compiling a text representation of a circuit to generate a first register transfer level netlist;
    selecting a portion of the text representation of the circuit;
    replicating the selected portion of the circuit;
    inserting delay logic to delay inputs to the replicated portion of the circuit; and
    recompiling the text representation of the circuit to generate a second register transfer level netlist.

17. The machine readable medium of claim 16, wherein the method further comprises mapping the first register transfer level netlist to a selected technology architecture.

18. The machine readable medium of claim 17, wherein the method further comprises performing a place and route operation to implement the circuit in the selected technology architecture.

19. The machine readable medium of claim 16, wherein the method further comprises programming the first register transfer level netlist into a programmable hardware device.

20. The machine readable medium of claim 16, wherein the method further comprises programming the second register transfer level netlist into a programmable hardware device.

21. The machine readable medium of claim 16, wherein the method further comprises generating an application specific integrated circuit from the second register transfer level netlist.

22. A computer system comprising:
    a bus;
    a data storage device coupled to the bus; and
    a processor coupled to the data storage device, the processor operable to receive instructions which, when executed by the processor, cause the processor to perform a debugging method comprising:
        compiling a text representation of a circuit to generate a first register transfer level netlist;
        selecting a portion of the text representation of the circuit;
        replicating the selected portion of the circuit;
        inserting delay logic to delay inputs to the replicated portion of the circuit; and
        recompiling the text representation of the circuit to generate a second register transfer level netlist.

23. The computer system of claim 22, wherein the method further comprises mapping the first and second register transfer level netlists to a selected technology architecture.

24. The computer system of claim 23, wherein the method further comprises performing a place and route operation to implement the circuit in the selected technology architecture.

25. The computer system of claim 22, wherein the method further comprises programming the first register transfer level netlist into a programmable hardware device.

26. The computer system of claim 22, wherein the method further comprises programming the second register transfer level netlist into a programmable hardware device.

27. The computer system of claim 22, wherein the method further comprises generating an application specific integrated circuit from the second register transfer level netlist.

* * * * *